United States Patent
Chiang et al.

(10) Patent No.: US 10,555,433 B1
(45) Date of Patent: Feb. 4, 2020

(54) CHASSIS

(71) Applicants: INVENTEC (PUDONG) TECHNOLOGY CORPORATION, Shanghai (CN); INVENTEC CORPORATION, Taipei (TW)

(72) Inventors: Chih-Wei Chiang, Taipei (TW); Yuan-Chang Yang, Taipei (TW); Shih-Wei Chen, Taipei (TW); Jeng-Ting Pan, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/198,540

(22) Filed: Nov. 21, 2018

(30) Foreign Application Priority Data

Oct. 26, 2018 (CN) .......................... 2018 1 1257355

(51) Int. Cl.
*G06F 1/16* (2006.01)
*H05K 7/14* (2006.01)

(52) U.S. Cl.
CPC ......... *H05K 7/1487* (2013.01); *H05K 7/1489* (2013.01)

(58) Field of Classification Search
CPC ..... H05K 7/1487; H05K 7/1489; G06F 1/187
See application file for complete search history.

(56) References Cited

U.S. PATENT DOCUMENTS

| 5,732,000 | A * | 3/1998 | Chiesi | G06F 1/181 |
| | | | | 361/679.57 |
| 6,462,954 | B1 * | 10/2002 | Kuo | H05K 3/325 |
| | | | | 361/736 |
| 6,924,975 | B2 * | 8/2005 | Lai | G06F 1/181 |
| | | | | 24/453 |
| 6,944,016 | B2 * | 9/2005 | Chen | E05C 1/12 |
| | | | | 292/163 |
| 7,408,767 | B2 * | 8/2008 | Han | G06F 1/187 |
| | | | | 312/223.2 |
| 7,543,786 | B2 * | 6/2009 | Yang | G11B 33/128 |
| | | | | 248/222.51 |
| 7,639,487 | B2 * | 12/2009 | Liang | G06F 1/187 |
| | | | | 361/679.33 |
| 7,758,133 | B2 * | 7/2010 | Chen | G06F 1/181 |
| | | | | 312/223.2 |
| 7,872,862 | B2 * | 1/2011 | Chang | G11B 33/127 |
| | | | | 211/26 |
| 8,336,838 | B2 * | 12/2012 | Tsai | G11B 33/123 |
| | | | | 248/220.21 |

(Continued)

*Primary Examiner* — Kimberley S Wright
(74) *Attorney, Agent, or Firm* — Maschoff Brennan

(57) ABSTRACT

A chassis includes a bottom plate, a fastener and a supporting component. The bottom plate includes a screw hole. The fastener comprises a threaded portion and a smooth portion that are connected to each other, and the threaded portion is configured to be screwed into the screw hole. The supporting component includes a through hole. The smooth portion of the fastener is configured to be disposed through the through hole so that the supporting component is rotatably disposed on the bottom plate so as to include a supporting position and a stored position. The supporting component is integrated.

8 Claims, 5 Drawing Sheets

(56) References Cited

U.S. PATENT DOCUMENTS

| | | | | |
|---|---|---|---|---|
| 8,465,221 | B2 * | 6/2013 | Yan | H05K 7/1489 |
| | | | | 248/220.22 |
| 8,797,733 | B2 * | 8/2014 | Lai | G06F 1/187 |
| | | | | 361/679.31 |
| 9,398,716 | B2 * | 7/2016 | Liao | H05K 7/1489 |
| 2005/0036280 | A1 * | 2/2005 | Lai | G06F 1/181 |
| | | | | 361/679.02 |
| 2005/0280982 | A1 * | 12/2005 | Yang | G11B 33/128 |
| | | | | 361/679.31 |
| 2006/0193111 | A1 * | 8/2006 | Han | G06F 1/184 |
| | | | | 361/679.58 |
| 2007/0121285 | A1 * | 5/2007 | Liang | G06F 1/187 |
| | | | | 361/679.57 |
| 2012/0292468 | A1 * | 11/2012 | Lai | G06F 1/187 |
| | | | | 248/221.11 |
| 2015/0029654 | A1 * | 1/2015 | Li | H05K 7/1489 |
| | | | | 361/679.32 |

\* cited by examiner

CHASSIS

CROSS-REFERENCE TO RELATED APPLICATIONS

This non-provisional application claims priority under 35 U.S.C. § 119(a) on Patent Application No(s). 201811257355.3 filed in China, on Oct. 26, 2018, the entire contents of which are hereby incorporated by reference.

BACKGROUND OF THE INVENTION

1. Technical Field of the Invention

The invention relates to chassis, more particularly to a chassis having a supporting component made of one piece.

2. Description of the Related Art

To stably support a server, the server chassis is usually mounted with supporting components at a bottom plate. Although the supporting components can enhance the stability of the server, the installation and the removal of side plates are affected by the supporting components. To avoid that, the supporting component are made of several pieces. In detail, the supporting components each include a fixing component and a rotatable component, the fixing component is screwed into a small screw hole of the bottom plate and the bottom plate needs to have a large fixing hole so that the fixing component can be fixed in the large fixing hole in a stable manner. The rotatable component is rotatably disposed on the fixing component to be able to be rotated with respect to the bottom plate.

Such supporting component is complicated in structure, and, when the server chassis is required to be installed in the server cabinet, the supporting component should be removed from the server chassis. Then the large fixing hole may expose the electronic components inside the server chassis. In such case, the electronic components should be arranged to avoid being exposed by the large fixing hole in order to meet the safety regulation. Therefore, the arrangement of the electronic components in the server chassis is limited by the supporting component.

SUMMARY OF THE INVENTION

An embodiment of the disclosure provides a chassis including a bottom plate, a fastener and a supporting component. The bottom plate includes a screw hole. The fastener comprises a threaded portion and a smooth portion that are connected to each other, and the threaded portion is configured to be screwed into the screw hole. The supporting component includes a through hole. The smooth portion of the fastener is configured to be disposed through the through hole so that the supporting component is rotatably disposed on the bottom plate so as to include a supporting position and a stored position. The supporting component is integrated.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
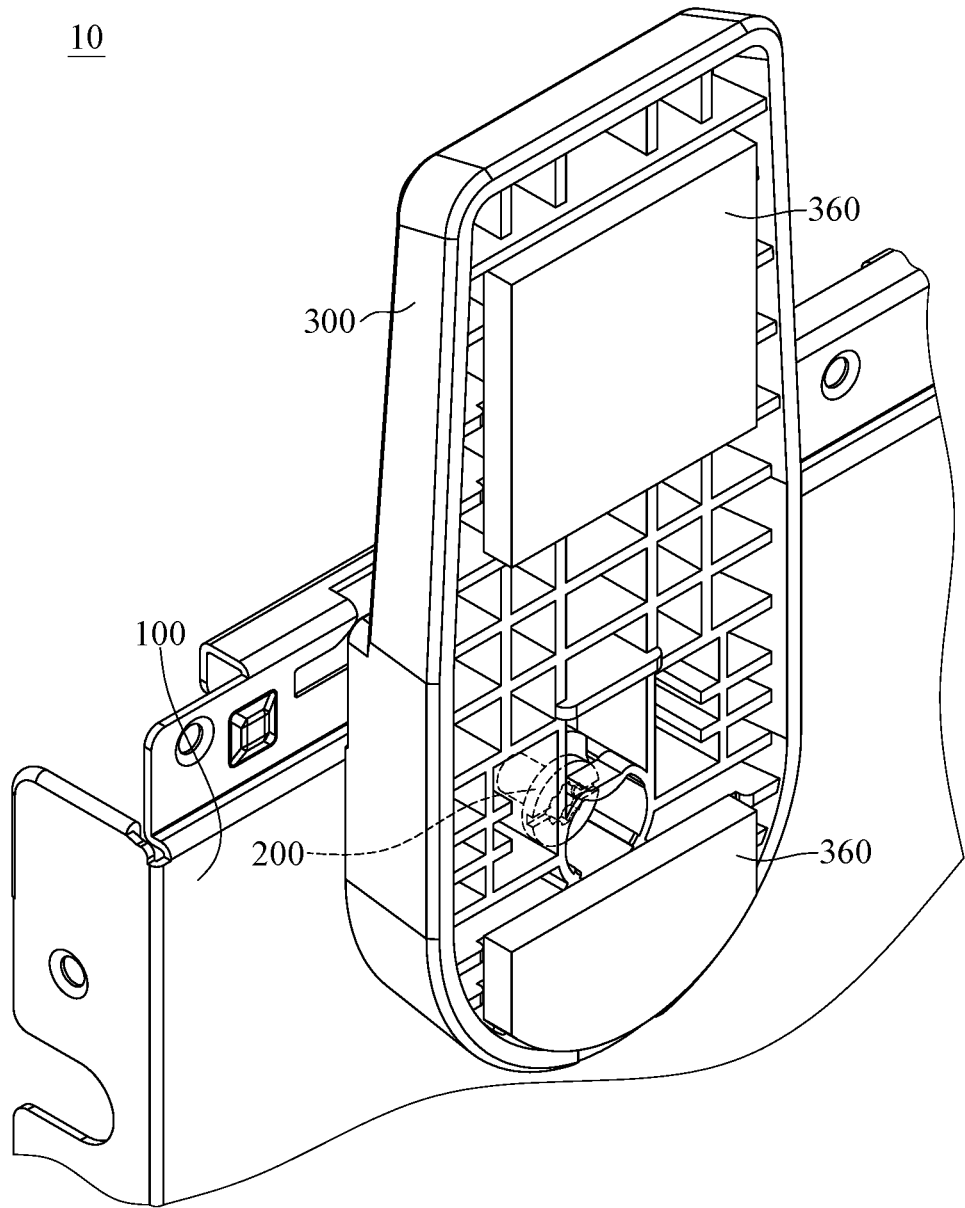
FIG. 1 is a partially enlarged prospective view of a chassis according to one embodiment of the invention.
Figure 2:
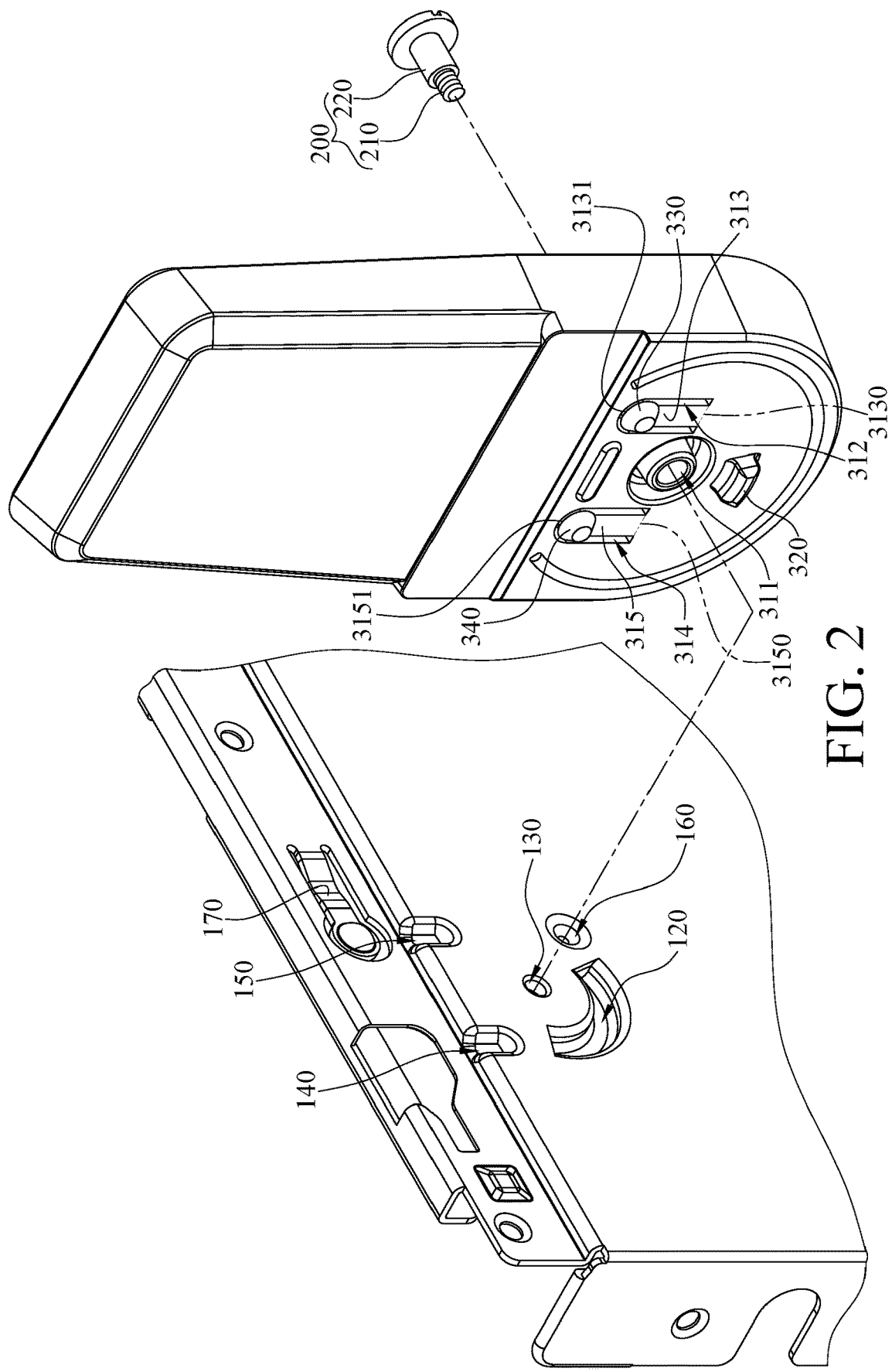
FIG. 2 is an exploded view of the chassis in FIG. 1.
Figure 3:
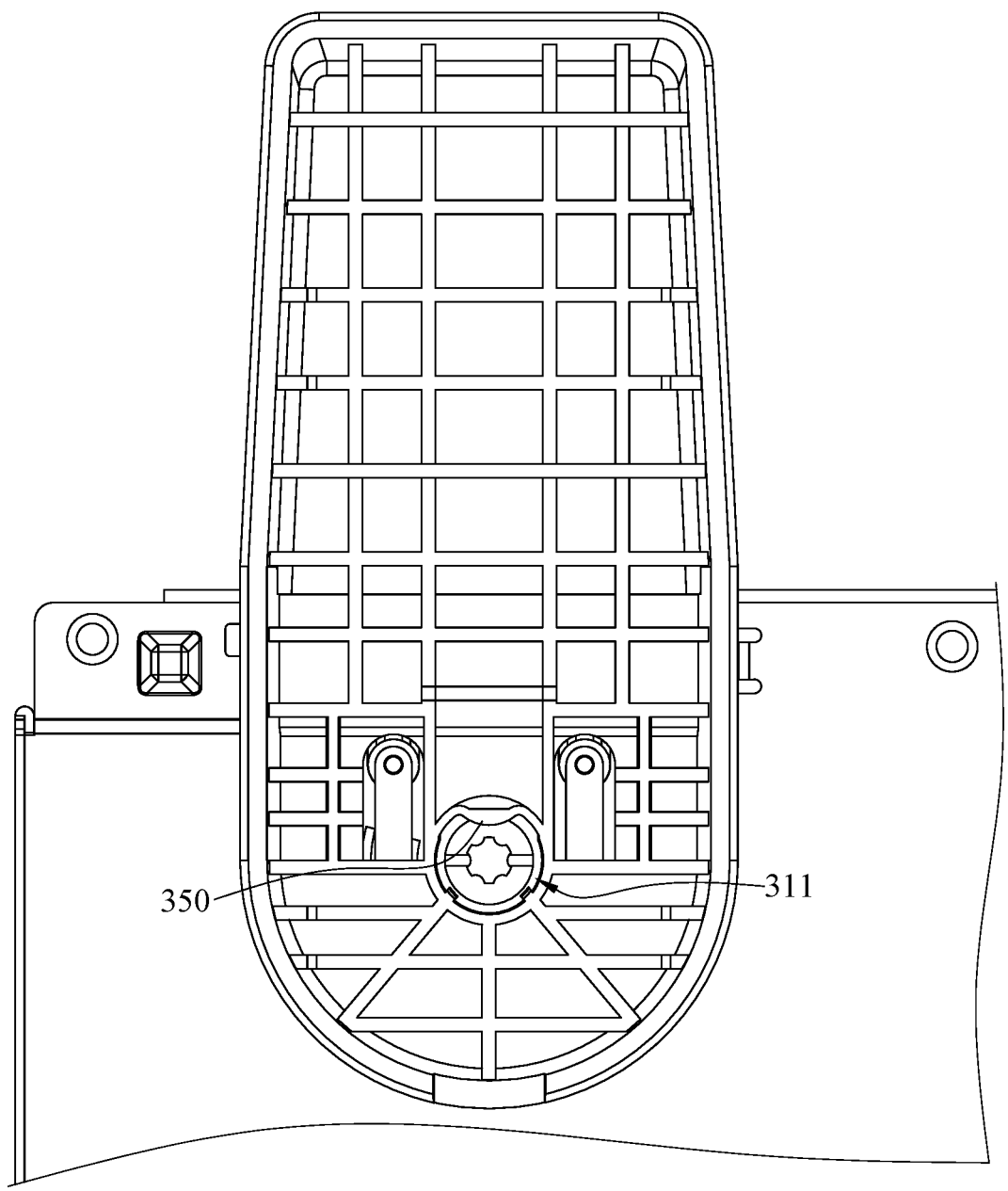
FIG. 3 is a bottom view of a supporting component in FIG. 1.

Please refer to FIG. 1 to FIG. 3. FIG. 1 is a partially enlarged prospective view of a chassis according to one embodiment of the invention. FIG. 2 is an exploded view of the chassis in FIG. 1. FIG. 3 is a bottom view of a supporting component in FIG. 1.

This embodiment provides a chassis 10 including a bottom plate 100, a fastener 200 and a supporting component 300.

The bottom plate 100 includes a first guiding portion 120. The bottom plate 100 includes a screw hole 130, a first positioning slot 140, a second positioning slot 150 and a third positioning slot 160. The first positioning slot 140, the second positioning slot 150 and the third positioning slot 160 may be blind slots not penetrating through the bottom plate 100. The first guiding portion 120 is, for example, a guide groove formed on the bottom plate 100 and may be a blind groove not penetrating through the bottom plate 100.

In this or other embodiments, the bottom plate 100 may further include a biasing portion 170, and the biasing portion 170 is fixed in the bottom plate 100 for mounting a side plate (not shown). However, the biasing portion 170 is optional.

The fastener 200 is, for example, a screw, and includes a threaded portion 210 and a smooth portion 220 that are connected to each other. The threaded portion 210 is configured to be screwed into the screw hole 130.

The supporting component 300 is integrated. That is, the supporting component 300 is made of one piece. The supporting component 300 includes a second guiding portion 320, a first positioning portion 330 and a second positioning portion 340.

The supporting component 300 includes a through hole 311. The smooth portion 220 is configured to be disposed through the through hole 311. As such, the supporting component 300 is able to be rotated with respective to the fastener 200 and rotatably disposed on the bottom plate 100, thereby being moved to several positions.

In this or other embodiments, the second guiding portion 320 is, for example, a guiding piece protruding from the supporting component 300. The first guiding portion 120 and the second guiding portion 320 are configured to fit each other for guiding the rotation of the supporting component 300. However, the first guiding portion 120 and the second guiding portion 320 are optional, and the invention is not limited thereto.

In this or other embodiments, the supporting component 300 may further include a first elastic arm 313 surrounded by a first slit 312 and a second elastic arm 315 surrounded by a second slit 314. In detail, the first elastic arm 313 includes a first fixed end 3130 and a first free end 3131 opposite to each other. The first fixed end 3130 is fixed to the supporting component 300, and the first positioning portion 330 protrudes from the first free end 3131 of the first elastic arm 313. The second elastic arm 315 includes a second fixed end 3150 and a second free end 3151 opposite to each other. The second fixed end 3150 is fixed to the supporting component 300 and the second positioning portion 340 protrudes from the second free end 3151 of the second elastic arm 315. The first positioning portion 330 and the second positioning portion 340 both fit the first positioning slot 140, the second positioning slot 150 and the third positioning slot 160 in order to position the supporting component 300 in the respective position. However, the first positioning slot 140, the second positioning slot 150, the third positioning slot 160, the first positioning portion 330 and the second positioning portion 340 are optional. That is, in another embodiment, the bottom plate may not have the first positioning slot, the second positioning slot, the third positioning slot, and the supporting component may not include the first positioning portion and the second positioning portion.

In this or other embodiments, the supporting component 300 may further include a stopper 350 located at a side of the through hole 311 that is away from the bottom plate 100 and protruding toward an axial center C of the through hole 311. Before disposing the chassis 10 in a cabinet (not shown), the fastener 200 should be disengaged from the screw hole 130 to detach the supporting component 300 from the bottom plate 100. The fastener 200 is movable in the through hole 311 when being detached, and the stopper 350 is able to prevent the fastener 200 from coming out of the through hole 311, thereby preventing the fastener 200 from losing. However, the stopper 350 is optional, and the invention is not limited thereto. In another embodiment, the supporting component may not have the stopper.

In this or other embodiments, the supporting component 300 may further include two pad portions 360 disposed on a side of the supporting component 300 that is away from the bottom plate 100 for stable the supporting component 300. The pad portion is optional and its quantity is not restricted. In another embodiment, the supporting component may only include one pad portion, or may not include the pad portion.

Furthermore, the quantity of the supporting component 300 is not restricted. In other embodiments, the chassis may include more than one supporting components depending on its size or other requirements.

Figure 4:
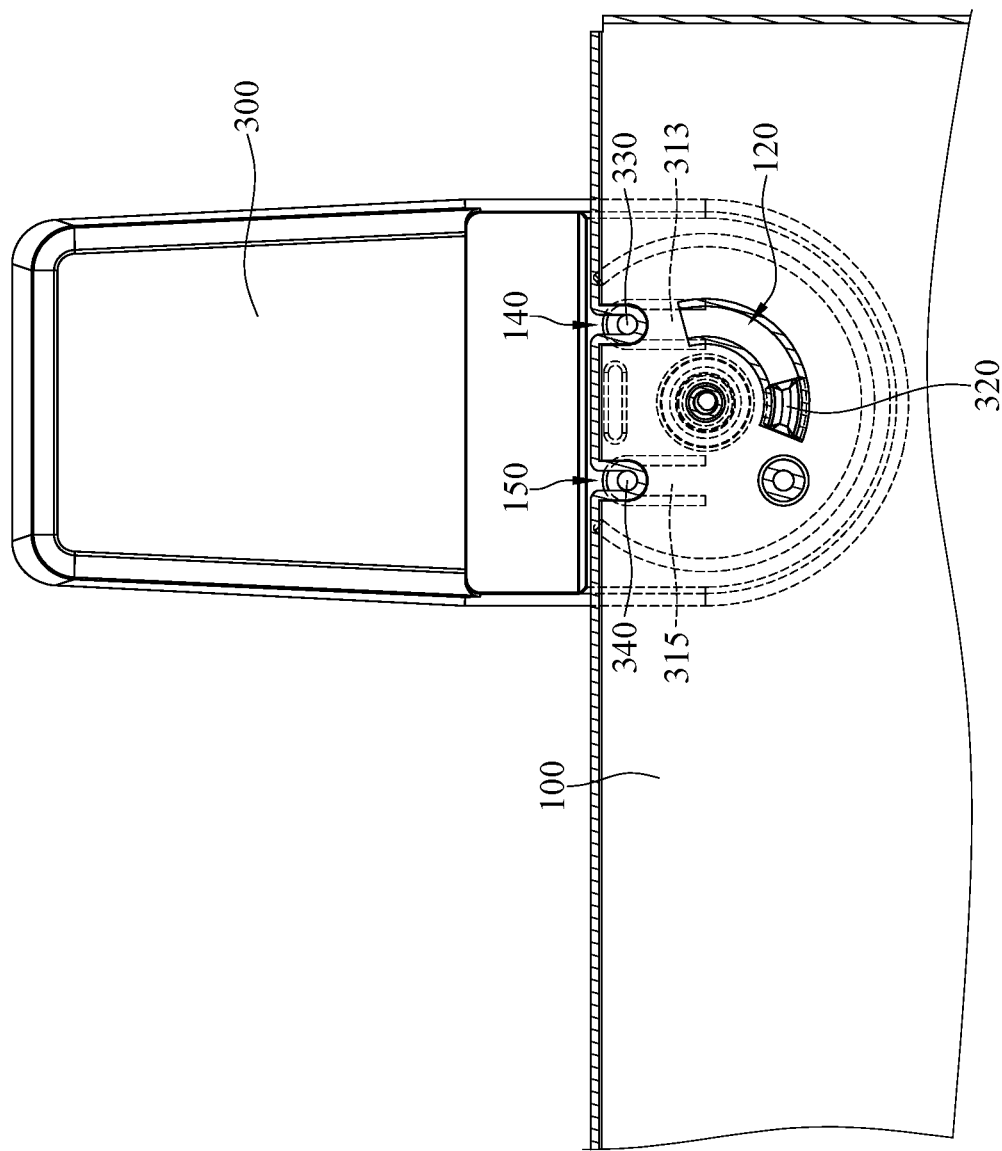
FIG. 4 is a partially enlarged cross-sectional view of the chassis in FIG. 1 when the supporting component is in a supporting position.
Figure 5:
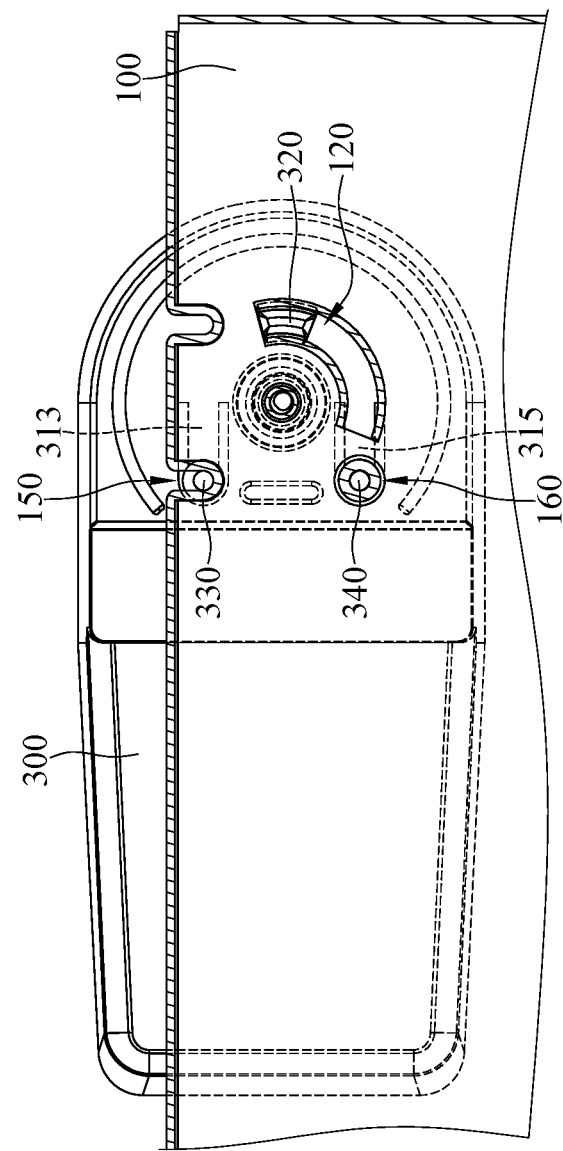
FIG. 5 is a partially enlarged cross-sectional view of the chassis in FIG. 1 when the supporting component is in a stored position.

Please refer to FIG. 4 and FIG. 5. FIG. 4 is a partially enlarged cross-sectional view of the chassis in FIG. 1 when the supporting component is in a supporting position. FIG. 5 is a partially enlarged cross-sectional view of the chassis in FIG. 1 when the supporting component is in a stored position.

As described above, the supporting component 300 is rotatably disposed on the bottom plate 100, such that the supporting component 300 is movable between a supporting position (as shown in FIG. 4) and a stored position (as shown in FIG. 5). When the supporting component 300 is in the supporting position, the first positioning portion 330 and the second positioning portion 340 are respectively located in the first positioning slot 140 and the second positioning slot 150 so as to fix the supporting component 300 in the supporting position.

When the supporting component 300 is rotated to the stored position, the first positioning portion 330 and the second positioning portion 340 are respectively located in the second positioning slot 150 and the third positioning slot 160 so as to fix the supporting component 300 in the stored position. During the movement of the supporting component 300, the second guiding portion 320 is able to be slid along the first guiding portion 120 so as to guide the supporting component 300 to move in the desired path; meanwhile, the first elastic arm 313 and the second elastic arm 315 are deformed to reduce the interference between the first and the second positioning portions 330 and 340 and the bottom plate 100, thereby making the movement of the supporting component 300 smoother. By rotating the supporting component 300 to the stored position, side plates (not shown) can be installed or removed more conveniently.

According to the chassis discussed above, since the threaded portion and the smooth portion of the fastener are respectively fixed to the screw hole of the bottom plate and located in the through hole of the supporting component, the supporting component can be rotatably disposed on the bottom plate only via the fastener. In this way, the supporting component can be made of one piece rather than being constituted of the fixing component and the rotatable component, so that the supporting component is simple in structure.

Moreover, when the hard disk bearing frame 40 is in the level position, a part of the protrusion part 64 and the connecting part 61 are respectively located on two opposite sides of the opening 27 of the pivotable frame 20 and the part of the protrusion part 64 protrudes from the pivotable frame 20.

Further, the bottom plate only includes a small screw hole so that electronic components may not be exposed as the supporting component is detached from the bottom plate. Therefore, the arrangement of the electronic components in the chassis may not be limited by the supporting component.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A chassis comprising:
   a bottom plate, comprising a screw hole, a first positioning slot, a second positioning slot, and a third positioning slot;
   a fastener, comprising a threaded portion and a smooth portion that are connected to each other, and the threaded portion configured to be screwed into the screw hole; and
   a supporting component, comprising a through hole, a first positioning portion, and a second positioning portion, the smooth portion of the fastener configured to be disposed through the through hole so that the supporting component is rotatably disposed on the bottom plate so as to comprise a supporting position and a stored position; wherein the first positioning slot, the second positioning slot and the third positioning slot are configured to be engaged with the first positioning portion and the second positioning portion;
   wherein, the supporting component is integrated, and the first positioning slot and the second positioning slot are configured to be engaged with the first positioning portion and the second positioning portion, and wherein when the supporting component is in the supporting position, the first positioning portion and the second positioning portion are respectively located in the first positioning slot and the second positioning slot; when the supporting component is in the stored position, the first positioning portion and the second positioning portion are respectively located in the second positioning slot and the third positioning slot.

2. The chassis according to claim 1, wherein the bottom plate comprises a first guiding portion, the supporting component comprises a second guiding portion, the first guiding portion and the second guiding portion are configured to be engaged with each other so as to guide the supporting component to rotate with respect to the bottom plate.

3. The chassis according to claim 2, wherein the first guiding portion is a guide groove formed on the bottom plate, and the second guiding portion is a guiding piece protruding from the supporting component.

4. The chassis according to claim 3, wherein the first guiding portion does not penetrate through the bottom plate.

5. The chassis according to claim 1, wherein the first positioning slot, the second positioning slot and the third positioning slot do not penetrate through the bottom plate.

6. The chassis according to claim 1, wherein the supporting component further comprises a first elastic arm that surrounded by a first slit and a second elastic arm that surrounded by a second slit, the first positioning portion is disposed on a first free end of the first elastic arm, and the second positioning portion is disposed on a second free end of the second elastic arm.

7. The chassis according to claim 2, wherein the supporting component further comprises a stopper located on a side of the through hole that is away from the bottom plate and protruding toward an axial center of the through hole.

8. The chassis according to claim 2, wherein the supporting component further comprises a pad portion located on a side of the supporting component that is away from the bottom plate.

* * * * *